United States Patent
Baba et al.

(10) Patent No.: US 12,261,217 B2
(45) Date of Patent: Mar. 25, 2025

(54) SEMICONDUCTOR DEVICE

(71) Applicant: FUJI ELECTRIC CO., LTD., Kawasaki (JP)

(72) Inventors: Masakazu Baba, Matsumoto (JP); Shinsuke Harada, Tsukuba (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 18/649,713

(22) Filed: Apr. 29, 2024

(65) Prior Publication Data
US 2024/0282850 A1    Aug. 22, 2024

Related U.S. Application Data

(63) Continuation of application No. 17/568,421, filed on Jan. 4, 2022, now Pat. No. 11,996,475.

(30) Foreign Application Priority Data

Jan. 6, 2021    (JP) .................. 2021-000963

(51) Int. Cl.
*H01L 29/78*    (2006.01)
*H01L 29/06*    (2006.01)
(Continued)

(52) U.S. Cl.
CPC ...... *H01L 29/7806* (2013.01); *H01L 29/0696* (2013.01); *H01L 29/1608* (2013.01);
(Continued)

(58) Field of Classification Search
CPC ............. H01L 29/7806; H01L 29/0696; H01L 29/1608; H01L 29/41741; H01L 29/41775;
(Continued)

(56) References Cited

U.S. PATENT DOCUMENTS

| | | |
|---|---|---|
| 5,614,749 A | 3/1997 | Ueno |
| 9,704,949 B1 | 7/2017 | Ghandi et al. |
| | (Continued) | |

FOREIGN PATENT DOCUMENTS

| | | |
|---|---|---|
| JP | H08-204179 A | 8/1996 |
| JP | 2009278067 A | 11/2009 |
| | (Continued) | |

OTHER PUBLICATIONS

Japanese Office Action dated Jul. 30, 2024, in the counterpart Japanese Patent Application No. 2021-000963.

*Primary Examiner* — Khaja Ahmad
*Assistant Examiner* — Khatib A Rahman
(74) *Attorney, Agent, or Firm* — Rabin & Berdo, P.C.

(57) ABSTRACT

A semiconductor device, including: a drift layer of a first conductivity type provided in a semiconductor base; a base layer of a second conductivity type provided in the semiconductor base at a front surface side thereof; a plurality of first trenches provided in the semiconductor base at a front surface side thereof, and having a plurality of first portions extending in a first direction to form a striped pattern; a second trench provided in the semiconductor base at a front surface side thereof, and having a plurality of second portions extending parallel to the first portions; a plurality of gate electrodes respectively provided in the first trenches; and a diode electrode provided in the second trench. The diode electrode includes: a plurality of inner electrodes provided in the second portions, and an outer electrode connecting the inner electrodes and surrounding ends of the first portions in a plan view.

20 Claims, 13 Drawing Sheets

(51) Int. Cl.
*H01L 29/16* (2006.01)
*H01L 29/417* (2006.01)
*H01L 29/423* (2006.01)
*H01L 29/47* (2006.01)
*H01L 29/49* (2006.01)

(52) U.S. Cl.
CPC .. *H01L 29/41741* (2013.01); *H01L 29/41775* (2013.01); *H01L 29/4238* (2013.01); *H01L 29/47* (2013.01); *H01L 29/4916* (2013.01); *H01L 29/7811* (2013.01); *H01L 29/7813* (2013.01)

(58) Field of Classification Search
CPC . H01L 29/4238; H01L 29/47; H01L 29/4916; H01L 29/7811; H01L 29/7813; H01L 29/0623; H01L 29/41766; H01L 29/66734
See application file for complete search history.

(56) References Cited

U.S. PATENT DOCUMENTS

| | | | |
|---|---|---|---|
| 2009/0283776 A1 | 11/2009 | Iwamuro | |
| 2015/0249083 A1* | 9/2015 | Okawara | H01L 29/1095 257/140 |
| 2015/0340443 A1* | 11/2015 | Wada | H01L 29/0688 257/77 |
| 2016/0254357 A1* | 9/2016 | Aketa | H01L 29/167 257/77 |
| 2017/0040423 A1 | 2/2017 | Inoue et al. | |
| 2019/0296143 A1* | 9/2019 | Wehrhahn-Kilian | H01L 29/4236 |
| 2019/0386131 A1* | 12/2019 | Takeuchi | H01L 21/02529 |
| 2020/0168719 A1* | 5/2020 | Liu | H01L 29/66727 |
| 2020/0220007 A1* | 7/2020 | Lin | H01L 29/872 |
| 2022/0102503 A1* | 3/2022 | Hatta | H01L 29/66068 |
| 2022/0231011 A1* | 7/2022 | Takaoka | H01L 29/7397 |
| 2022/0254906 A1* | 8/2022 | Nagahisa | H01L 29/7806 |
| 2023/0170410 A1 | 6/2023 | Mori et al. | |
| 2023/0187486 A1* | 6/2023 | Nakagawa | H01L 29/7811 257/77 |

FOREIGN PATENT DOCUMENTS

| | | |
|---|---|---|
| JP | 2010225615 A | 10/2010 |
| JP | 2018-006630 A | 1/2018 |
| JP | 2019525457 A | 9/2019 |
| WO | 2016006263 A1 | 1/2016 |
| WO | 2022/024812 A1 | 2/2022 |

* cited by examiner

SEMICONDUCTOR DEVICE

CROSS REFERENCE TO RELATED APPLICATIONS

This application is a continuation application of U.S. application Ser. No. 17/568,421, filed on Jan. 4, 2022, which is based upon and claims the benefit of priority of the prior Japanese Patent Application No. 2021-000963, filed on Jan. 6, 2021. The entire contents of the prior applications are incorporated herein by reference.

BACKGROUND OF THE INVENTION

1. Field of the Invention

The invention relates to a semiconductor device.

2. Description of the Related Art

Conventionally, in a power semiconductor device element, a vertical MOSFET (metal oxide semiconductor field effect transistor) having a trench structure is fabricated (manufactured) to reduce on-resistance of the device element. Cell density per unit area may be increased to a greater extent with a trench structure in which a channel is formed orthogonal to the substrate surface than in a planar structure in which a channel is formed parallel to the substrate surface and thus, current density per unit area may be increased in a vertical MOSFET, which is advantageous in terms of cost.

A vertical MOSFET has a built-in parasitic pn diode formed, as a body diode between a source and drain, by a p-type base layer and an n-type drift layer. Therefore, a freewheeling diode (FWD) used in an inverter may be omitted, thereby contributing to reductions in cost and size. Nonetheless, in an instance in which a silicon carbide substrate is used as a semiconductor substrate, compared to an instance in which a silicon (Si) substrate is used, the parasitic pn diode has high built-in potential and therefore, the on-resistance of the parasitic pn diode increases, leading to increased loss. Further, in an instance in which the parasitic pn diode turns on and conducts, characteristics change over time (degrade over time) due to bipolar operation of the parasitic pn diode, whereby forward degradation and turn-on loss occur.

In regard to these problems, a Schottky barrier diode (SBD) may be connected in parallel to the MOSFET on the circuit so that current flows to the SBD but not to the parasitic pn diode during freewheeling. Nonetheless, the number of necessary SBD chips is about the same as that for the MOSFET and therefore, cost increases.

Thus, a technique has been proposed in which a contact trench that penetrates through a p-type channel portion is formed at the substrate surface, an SBD is encapsulated by inner walls of the trench, and current during freewheeling passes through the built-in SBD and not a PiN diode (for example, refer to Japanese Laid-Open Patent Publication No. H08-204179).

FIG. 24 is a top view depicting a structure of a conventional built-in SBD silicon carbide semiconductor device. FIG. 25 is a cross-sectional view of a portion along C-C' in FIG. 24 depicting the structure of the conventional built-in SBD silicon carbide semiconductor device. As depicted in FIG. 24, a built-in SBD silicon carbide semiconductor device 150 includes an active region 140 in which a device element structure is formed and through which a current passes during an on-state, an edge region 142 that surrounds a periphery of the active region 140 and sustains a breakdown voltage, and a connecting region 141 between the active region 140 and the edge region 142. The active region 140 is a region surrounded by dotted and dashed line in FIG. 24.

Further, as depicted in FIG. 25, a MOS gate of a general trench gate structure is included on a front surface (surface having a later-described p-type base layer 116) side of a semiconductor base containing silicon carbide (hereinafter, silicon carbide base). The silicon carbide base (semiconductor chip) is formed by sequentially growing, epitaxially, silicon carbide layers constituting an $n^-$-type drift layer 101, an n-type region 115 constituting a current spreading region, and the p-type base layer 116, on an $n^+$-type silicon carbide substrate (hereinafter, $n^+$-type silicon carbide substrate) 102 that contains silicon carbide.

On the $n^+$-type silicon carbide substrate 102, an $n^-$-type layer constituting the $n^-$-type drift layer 101 is epitaxially grown and at a front surface (surface having the $n^-$-type drift layer 101) side of the $n^+$-type silicon carbide substrate 102, a MOS gate structure is provided formed by the p-type base layer 116, $n^+$-type source regions 117, trench gates 131, gate insulating films 119, and gate electrodes 120. Further, reference numerals 118, 121, and 122 are $p^{++}$-type contact regions, an interlayer insulating film, and a source electrode.

In the n-type region 115, first $p^+$-type regions 103 are selectively provided so as to underlie entire areas of bottoms of the trench gates 131. Further, in the n-type region 115, the first $p^+$-type regions 103 are selectively provided so as to underlie entire areas of bottoms of trench SBDs 132. The first $p^+$-type regions 103 are provided at a depth not reaching the $n^-$-type drift layer 101. Further, in the edge region 142, second $p^+$-type regions 104 are provided on an entire area of the surface of each of the first $p^+$-type regions 103.

Further, the trench SBDs 132 have inner walls covered by a Schottky metal 129 connected to the source electrode 122 and are trenches that form Schottky barrier diodes with semiconductor regions exposed at the inner walls and the Schottky metal 129. In this manner, in FIG. 24, a parasitic Schottky diode (built-in SBD) is provided in parallel to a parasitic pn diode between the source and drain.

As depicted in FIG. 24, in the conventional built-in SBD silicon carbide semiconductor device, to facilitate connection of the trench gates 131 to a gate runner (not depicted) provided in the edge region 142, the trench gates 131 are longer than the trench SBDs 132.

When positive voltage is applied to the source electrode 122 and negative voltage is applied to a drain electrode (not depicted) provided on a back surface of the $n^+$-type silicon carbide substrate 102 (when the MOSFET is off), a pn junction between the p-type base layer 116 and the $n^-$-type drift layer 101 is forward biased. In FIG. 24, when the MOSFET is off, the parasitic Schottky diode is designed to turn on before the parasitic pn diode turns on, whereby bipolar operation of the parasitic pn diode is inhibited and degradation over time due to bipolar operation may be prevented.

Further, a commonly known configuration includes multiple rings formed by a p-type layer constituted by an epitaxial film provided in linear trenches disposed in framelike patterns surrounding a cell portion, and a Schottky electrode disposed so as to cover some of the rings closest to the cell portion (for example, refer to Japanese Laid-Open Patent Publication No. 2018-006630).

SUMMARY OF THE INVENTION

To solve the problems below and achieve an object of the present invention, a semiconductor device according to the invention has the following features. On a front surface of a semiconductor substrate of a first conductivity type, a first semiconductor layer of a first conductivity type and having an impurity concentration lower that is than that of the semiconductor substrate is provided. A second semiconductor layer of a second conductivity type is provided on a side of the first semiconductor layer, that is opposite to a side of the first semiconductor layer, that faces the semiconductor substrate. A first semiconductor region of the first conductivity type and having an impurity concentration that is higher than that of the semiconductor substrate are selectively provided in the second semiconductor layer. Second semiconductor regions of the second conductivity type are provided in the first semiconductor layer. Third semiconductor regions of the second conductivity type and having bottoms in contact with the second semiconductor regions are provided in a surface layer of the first semiconductor layer. A first trench and a second trench that penetrate first semiconductor region and the second semiconductor layer and reach the first semiconductor layer are provided. A gate electrode is provided in the first trench via a gate insulating film. A Schottky electrode is provided in the second trench. The first trenches are provided in a striped pattern in a plan view, and the second trench surrounds the first trenches.

A further feature is that the semiconductor device according to the present invention described above includes a junction termination extension structure for enhancing the breakdown voltage, provided in an edge region that sustains a breakdown voltage and surrounds an active region in which current flows during an on-state; the second trench has stripe pattern portions that are parallel to the first trenches and an outer peripheral portion that connects ends of the stripe pattern portions to one another; a distance between the outer peripheral portion of the second trench and each end of each of the first trenches is at least equal to an interval between the second trench and the first trenches; and the each end of the each of the first trenches is provided closer to the active region than is the junction termination extension structure.

A further feature is that in the semiconductor device according to the present invention described above, the second trench is configured by a heterojunction with a polysilicon.

A further feature is that in the semiconductor device according to the present invention described above, a portion of the second trench is provided at a position that faces, in a depth direction, a gate contact region that connects a gate runner and the gate electrodes.

DETAILED DESCRIPTION OF THE INVENTION

Figure 24:
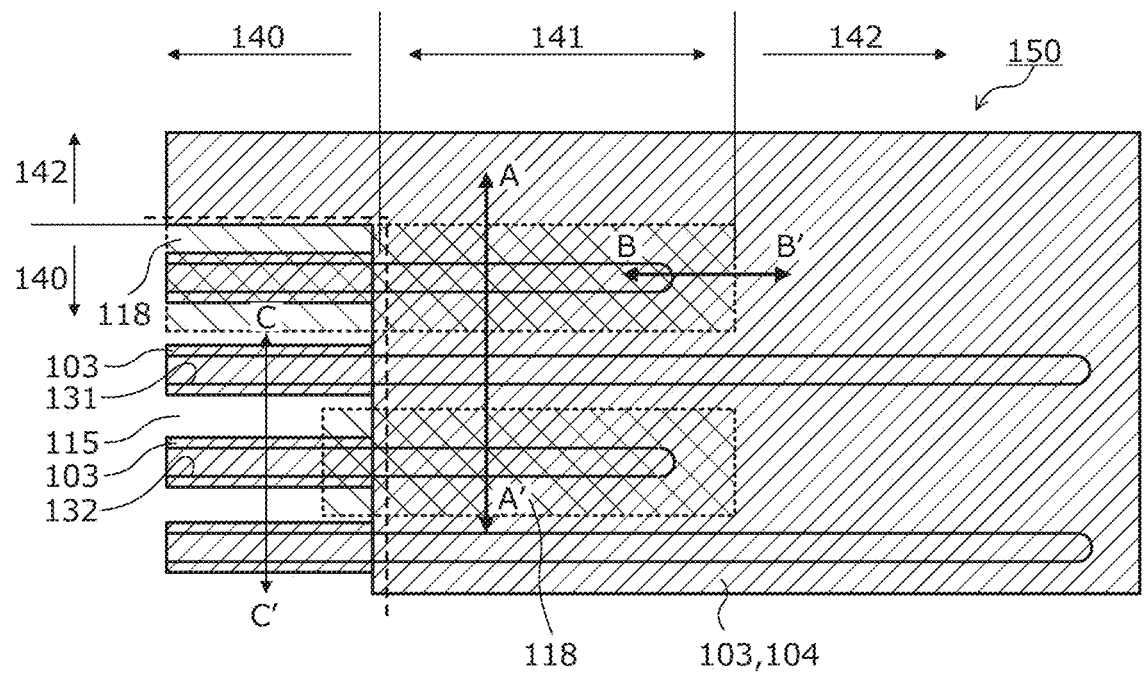
FIG. 24 is a top view depicting a structure of a conventional built-in SBD silicon carbide semiconductor device.
Figure 25:
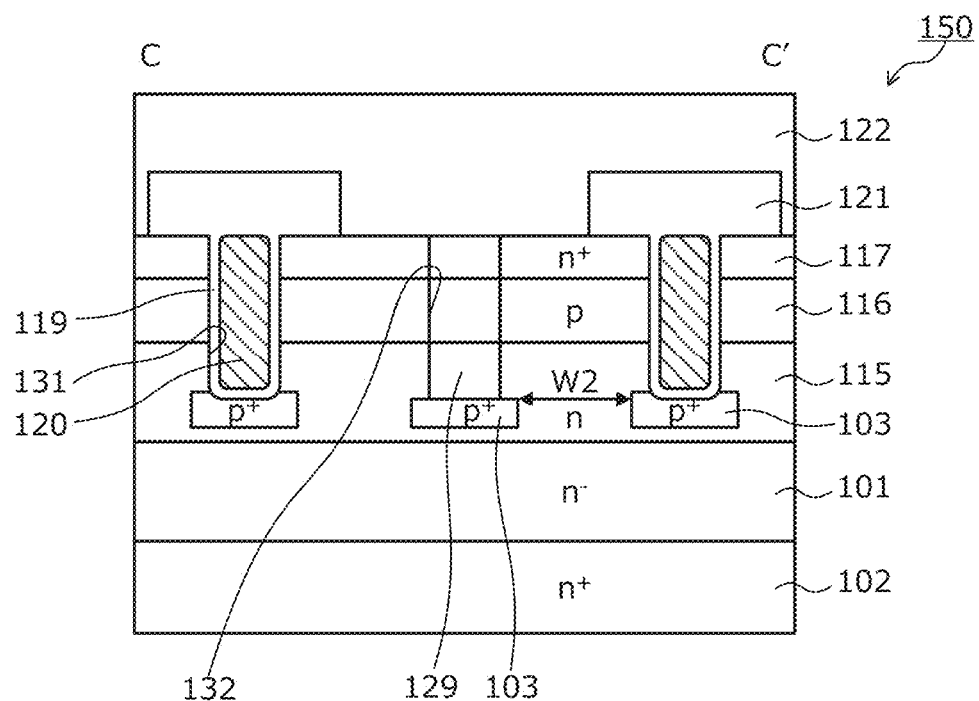
FIG. 25 is a cross-sectional view of a portion along C-C' in FIG. 24 depicting the structure of the conventional built-in SBD silicon carbide semiconductor device.
Figure 26:
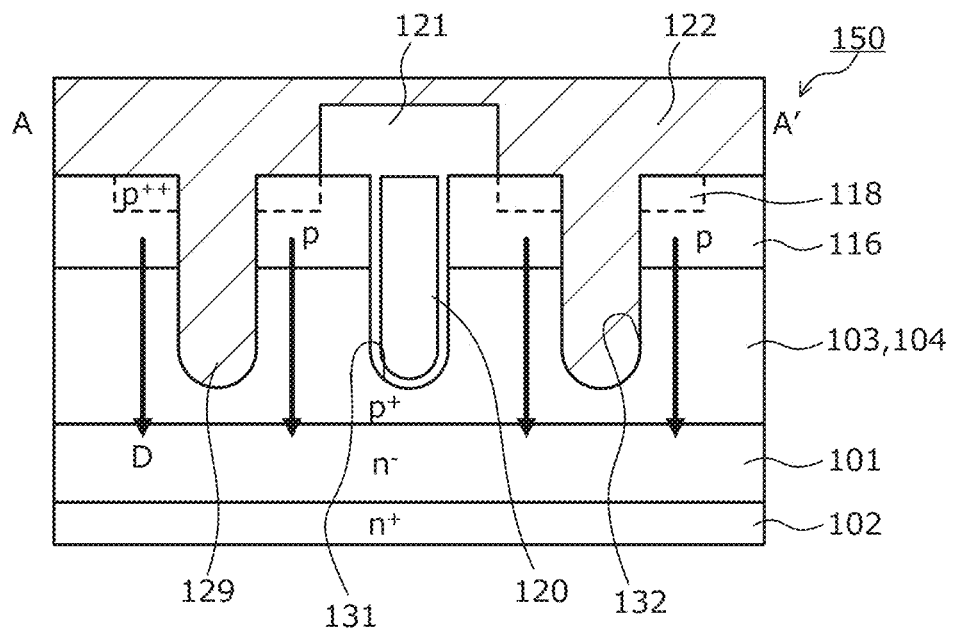
FIG. 26 is a cross-sectional view of a portion along A-A' in FIG. 24 depicting the structure of the conventional built-in SBD silicon carbide semiconductor device.
Figure 27:
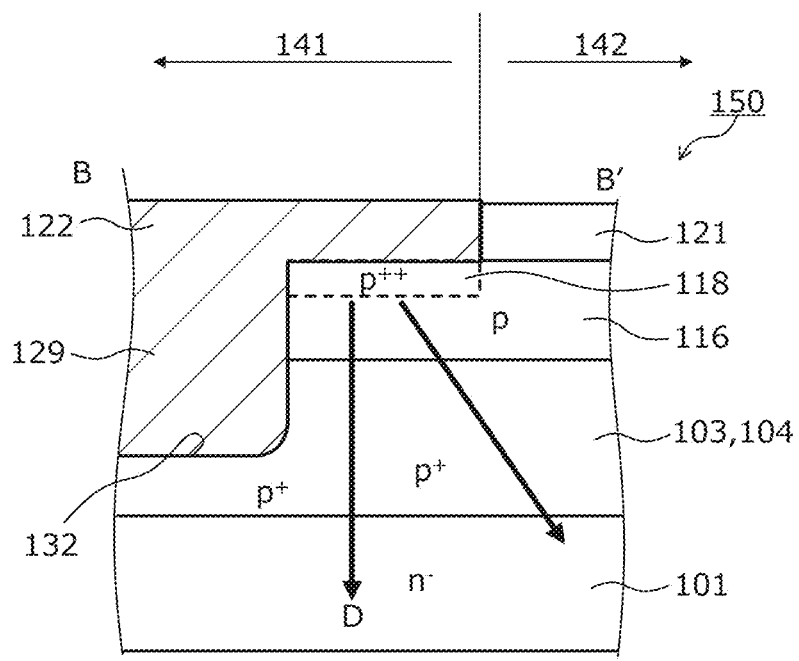
FIG. 27 is a cross-sectional view of a portion along B-B' in FIG. 24 depicting the structure of the conventional built-in SBD silicon carbide semiconductor device.

Problems to be addressed are discussed. FIG. 26 is a cross-sectional view of a portion along A-A' in FIG. 24 depicting the structure of the conventional built-in SBD silicon carbide semiconductor device. Further, FIG. 27 is a cross-sectional view of a portion along B-B' in FIG. 24 depicting the structure of the conventional built-in SBD silicon carbide semiconductor device. As depicted in FIG. 26 and FIG. 27, in the connecting region 141, the second p$^+$-type region 104 is provided on the first p$^+$-type region 103. Further, in a surface layer of the p-type base layer 116, the p$^{++}$-type contact regions 118 that are in contact with the trench SBDs 132 are provided. Therefore, in the connecting region 141, the trench SBDs 132 have a structure in which peripheries thereof are surrounded by p-type regions (the p-type base layer 116, the p$^{++}$-type contact regions 118, the first p$^+$-type region 103, and the second p$^+$-type region 104).

As a result, in the connecting region 141, the trench SBDs 132 do not function as a parasitic Schottky diode and bipolar operation of the parasitic pn diode cannot be inhibited. In an instance in which the parasitic pn diode turns on and conducts, due to the bipolar operation of the parasitic pn diode, hole current flows as indicated by a path D in FIG. 26 and FIG. 27, stacking faults are generated and expand due to energy generated by recombination by the hole current and electron current.

Therefore, the connecting region 141 has a problem in that characteristics change over time (degrade over time) to a greater extent than in the active region 140 due to the bipolar operation of the parasitic pn diode while increases in forward degradation and turn-on loss occur.

One object of the present invention is to provide a semiconductor device of which capability does not drop during freewheeling.

Embodiments of a semiconductor device according to the present invention is described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and will not be repeatedly described. Further, in the present description, when Miller indices are described, "−" means a bar added to an index immediately after the "−", and a negative index is expressed by prefixing "−" to the index.

Figure 1:
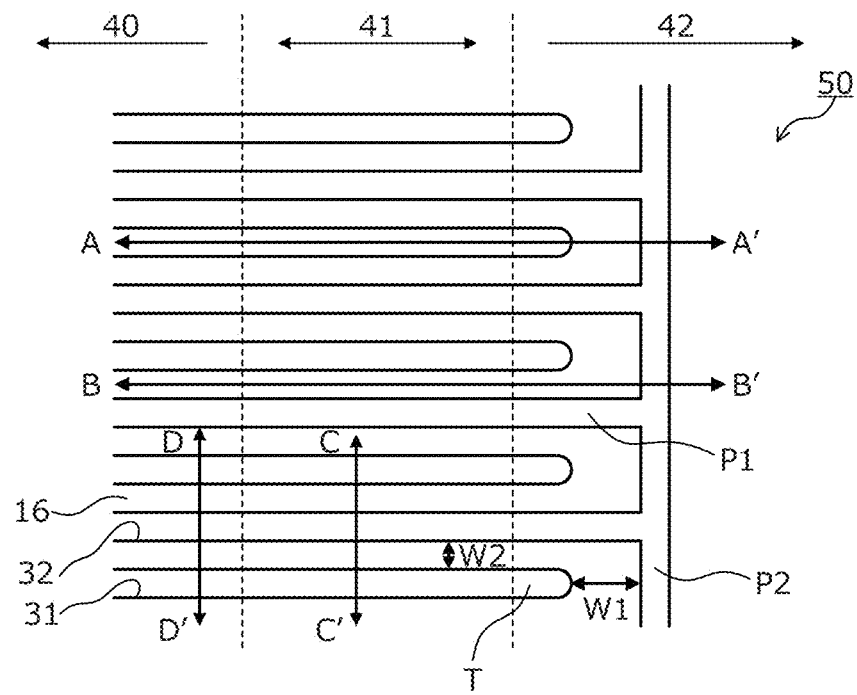
FIG. 1 is a top view depicting a structure of a silicon carbide semiconductor device according to an embodiment.
Figure 2:
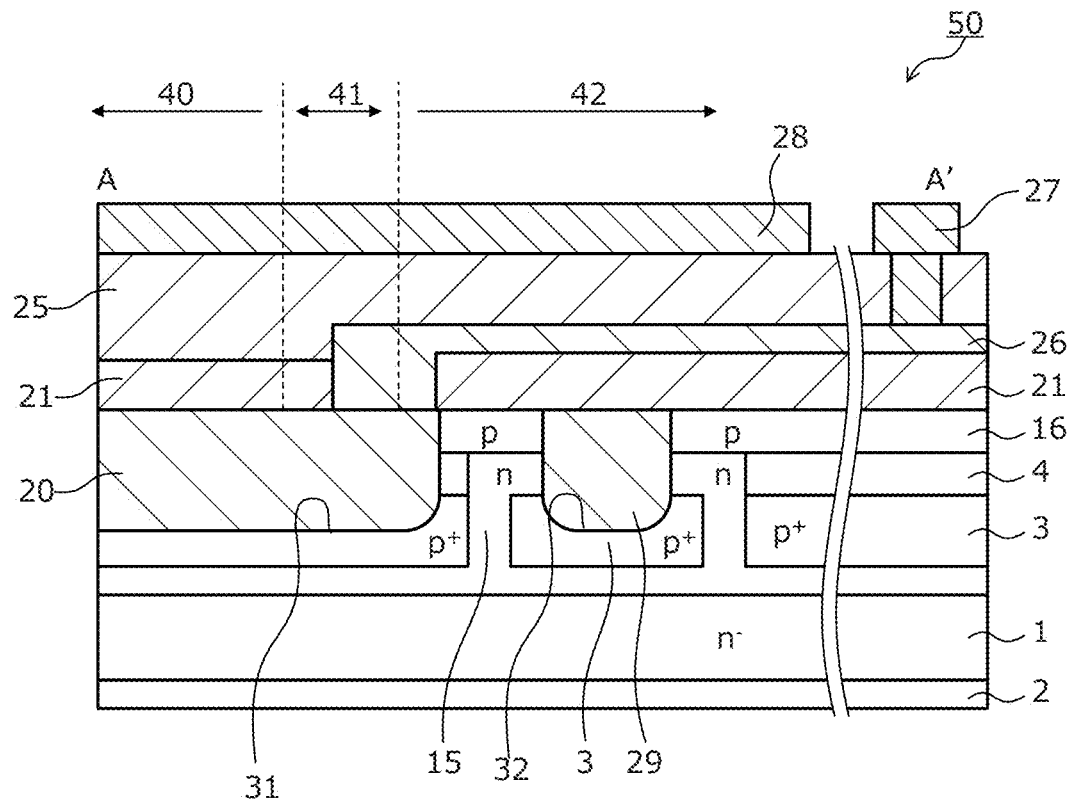
FIG. 2 is a cross-sectional view of a portion along A-A' in FIG. 1 depicting the structure of the silicon carbide semiconductor device according to the embodiment.
Figure 3:
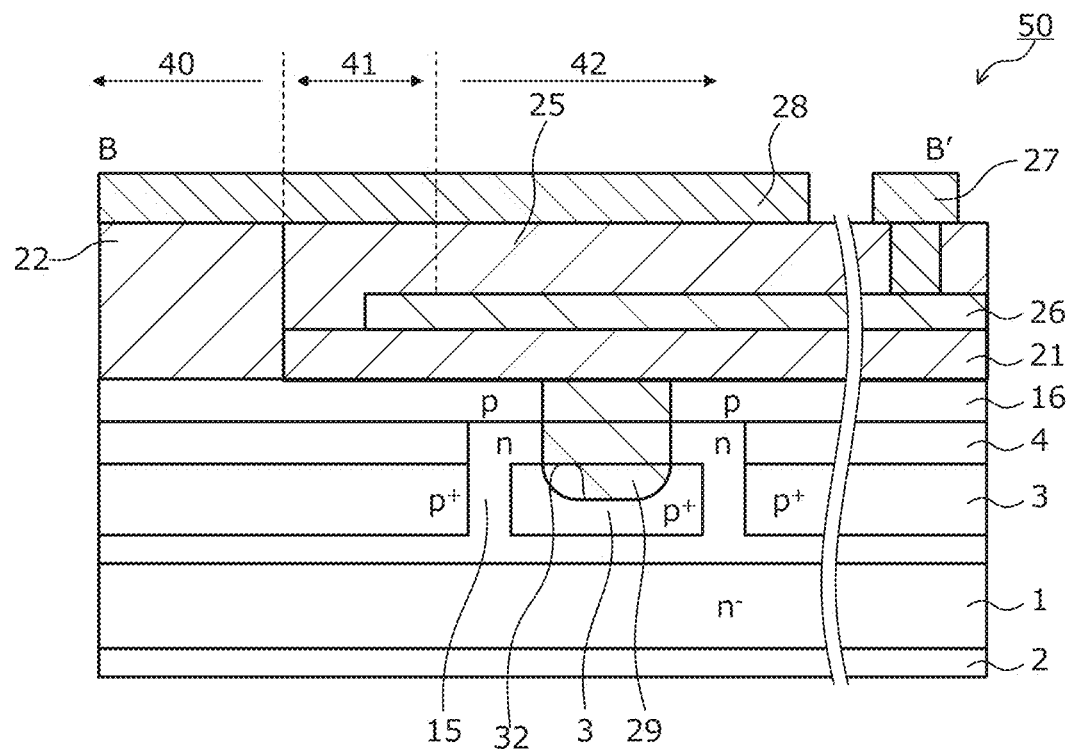
FIG. 3 is a cross-sectional view of a portion along B-B' in FIG. 1 depicting the structure of the silicon carbide semiconductor device according to the embodiment.
Figure 4:
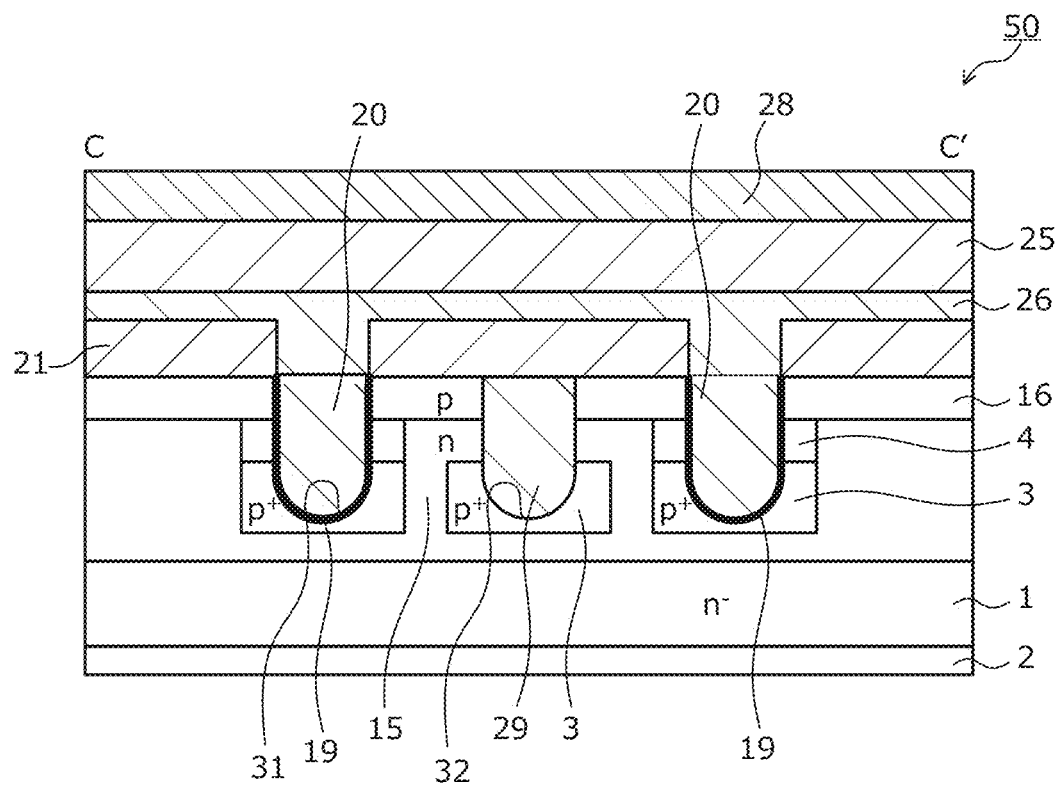
FIG. 4 is a cross-sectional view of a portion along C-C' in FIG. 1 depicting the structure of the silicon carbide semiconductor device according to the embodiment.
Figure 5:
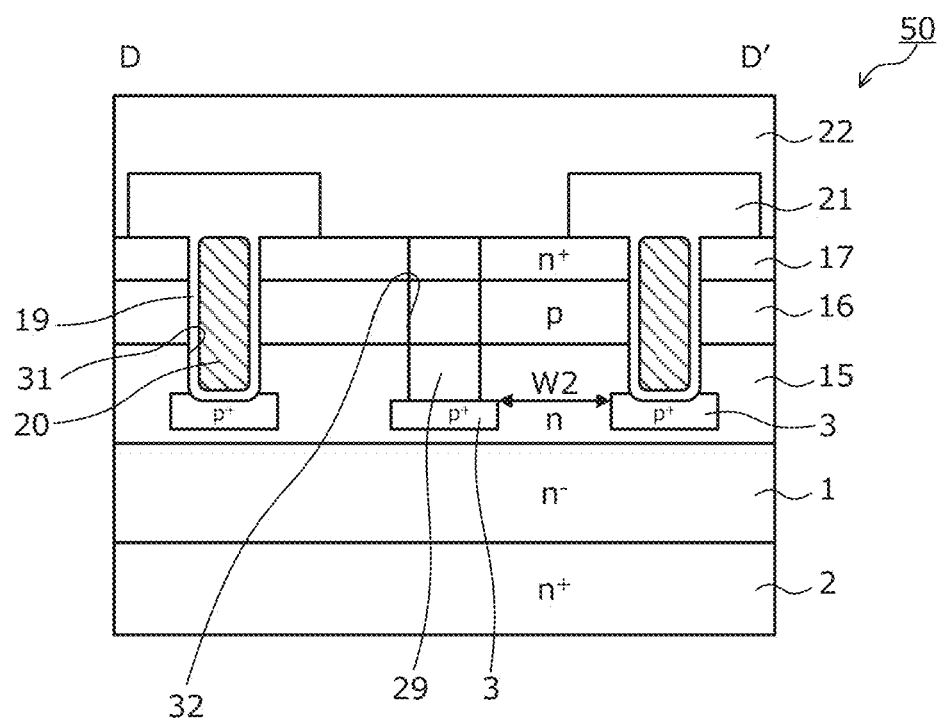
FIG. 5 is a cross-sectional view of a portion along D-D' in FIG. 1 depicting the structure of the silicon carbide semiconductor device according to the embodiment.

A semiconductor device according to the present invention is configured using a semiconductor having a band gap that is wider than that of silicon (hereinafter, wide band gap semiconductor). Herein, a structure of a semiconductor device (silicon carbide semiconductor device) in which, for example, silicon carbide (SiC) is used as a wide band gap semiconductor is described as an example. FIG. 1 is a top view depicting a structure of a silicon carbide semiconductor device according to an embodiment. FIG. 2 is a cross-sectional view of a portion along A-A' in FIG. 1 depicting the structure of the silicon carbide semiconductor device according to the embodiment. FIG. 3 is a cross-sectional view of a portion along B-B' in FIG. 1 depicting the structure of the silicon carbide semiconductor device according to the embodiment. FIG. 4 is a cross-sectional view of a portion along C-C' in FIG. 1 depicting the structure of the silicon carbide semiconductor device according to the embodiment. Here, FIG. 5 is a cross-sectional view of a portion along D-D' in FIG. 1 depicting the structure of the silicon carbide semiconductor device according to the embodiment. FIG. 4 is a cross-sectional view of the portion along C-C' in a connecting region 41 and FIG. 5 is a cross-sectional view of the portion along D-D' in an active region through which a main current flows in a thickness direction of the substrate when an element structure is formed and is in an on-state.

As depicted in FIG. 1, a built-in SBD silicon carbide semiconductor device 50 is configured by an active region 40 in which a device element structure is formed and through which a main current passes in the thickness direction of the substrate during an on-state, an edge region 42 that surrounds a periphery of the active region 40 and sustains a breakdown voltage, and the connecting region 41 between the active region 40 and the edge region 42. The active region 40 is a region surrounded by a dotted and dashed line in FIG. 1. The connecting region 41, as depicted in FIG. 4, is a region that does not function as a MOS and in which side surfaces of later-described trench gates 31 are covered by p-type regions. The silicon carbide semiconductor device according to the embodiment depicted in FIGS. 1 to 4 is the built-in SBD silicon carbide semiconductor device 50 that includes MOS gates at a front surface (surface having a later-described p-type base layer 16) of a semiconductor base (silicon carbide base: semiconductor chip) containing silicon carbide.

The silicon carbide base is formed by sequentially growing, epitaxially on an n$^+$-type silicon carbide substrate (semiconductor substrate of a first conductivity type) 2 containing silicon carbide, silicon carbide layers constituting an n$^−$-type drift layer (first semiconductor layer of the first conductivity type) 1 and a p-type base layer (second semiconductor layer of a second conductivity type) 16. In the active region 40, the MOS gates are configured by the p-type base layer 16, n$^+$-type source regions (first semiconductor regions of the first conductivity type) 17, a gate insulating film 19, and gate electrodes 20. In particular, in a surface layer of the n$^−$-type drift layer 1, the surface layer being on a source side (side facing a later-described source electrode 22), an n-type region 15 may be provided so as to be in contact with the p-type base layer 16. The n-type region 15 is a so-called current spreading layer (CSL) that reduces carrier spreading resistance. The n-type region 15, for example, is provided uniformly in a direction parallel to a base front surface (the front surface of the silicon carbide base).

In the n-type region 15 (in an instance in which the n-type region 15 is omitted, the n$^−$-type drift layer 1, hereinafter, simply "(1)"), first p$^+$-type regions (second semiconductor regions of the second conductivity type) 3 are selectively provided. The first p$^+$-type regions 3 are provided so as to be in contact with bottoms of the later-described trench gates (first trenches) 31 and a bottom of a later-described trench SBD (second trench) 32. Further, in the surface layer of the n-type region 15 (1), second p$^+$-type regions (third semiconductor regions of the second conductivity type) 4 are selectively provided. The second p$^+$-type regions 4 are provided so that bottoms thereof are in contact with the first p$^+$-type regions 3.

In an instance in which the n-type region 15 is provided, the first p$^+$-type regions 3 are provided from a depth position closer to a drain than is an interface between the p-type base layer 16 and the n-type region 15 to a depth not reaching an interface between the n-type region 15 and the n⁻-type drift layer 1. The first p⁺-type regions 3 are provided, whereby near the bottom of the trench SBD 32 and the bottoms of the trench gates 31, pn junctions between the first p⁺-type regions 3 and the n-type region 15 (1) may be formed. The first p⁺-type regions 3 and the second p⁺-type regions 4 have impurity concentrations higher than an impurity concentration of the p-type base layer 16.

Further, the n⁺-type source regions 17 are selectively provided in the p-type base layer 16. The n⁺-type source regions 17 and p⁺⁺-type contact regions (fifth semiconductor regions of the second conductivity type) (not depicted) may be selectively provided so as to be in contact with one another. In this instance, the p⁺⁺-type contact regions may have a depth that is, for example, the same as that of the n⁺-type source regions 17 or deeper than that of the n⁺-type source regions 17.

The trench gates 31 penetrate through the n⁺-type source regions 17 and the p-type base layer 16 from the base front surface and reach the n-type region 15 (1). In the trench gates 31, the gate insulating film 19 is provided along sidewalls of the trench gates 31 and on the gate insulating film 19, the gate electrodes 20 are provided. The gate electrodes 20 have ends facing a source and the ends may protrude outward from the base front surface. The gate electrodes 20 are electrically connected to a gate electrode pad (not depicted). An interlayer insulating film 21 is provided on the base front surface so as to cover the gate electrodes 20 embedded in the trench gates 31. The interlayer insulating film 21 has openings in the connecting region 41 and in the openings, the gate electrodes 20 are connected to a gate runner 27 via a gate contact region 26 of a polysilicon layer.

The trench SBD 32 penetrates through the n⁺-type source regions 17 and the p-type base layer 16 from the base front surface and reaches the n-type region 15 (1). In the trench SBD 32, sidewalls of the trench SBD 32 are covered by a Schottky metal 29 connected to the source electrode 22 while semiconductor regions exposed at inner walls of the trench SBD 32 and the Schottky metal 29 form Schottky barrier junctions. Further, an oxide film, for example, silicon dioxide ($SiO_2$) may be provided on the Schottky metal 29.

As depicted in FIG. 1, in the embodiment, the trench SBD 32 surrounds the trench gates 31. As depicted in later-described FIG. 6, "surrounding" is a need to cross the trench SBD 32 to reach the edge region 42 from any point of the trench gates 31, in a plan view. For example, the trench gates 31 are provided to have a striped pattern in the plan view and the trench SBD 32 has linear portions P1 that are longer than the trench gates 31 and that are provided parallel to the trench gates 31, and an outer peripheral portion P2 that connects the linear portions. As a result, portions of the trench gates 31 in contact with the source electrode 22 are in a region surrounded by the trench SBD 32. Therefore, outside the region surrounded by the trench SBD 32, when a negative bias is applied to a drain side of the built-in SBD silicon carbide semiconductor device, bipolar operation of a parasitic pn diode is eliminated and forward degradation as well as increases in turn-on loss may be suppressed.

Further, as depicted in FIG. 4, in the connecting region 41, the sidewalls of the trench SBD 32 are not in contact with the second p⁺-type regions 4. In other words, a portion of p-type regions (the first and the second p⁺-type regions 103, 104) embedded in a periphery of the trench SBDs 132 is opened in the conventional built-in SBD silicon carbide semiconductor device, whereby the trench SBD 32 of the embodiment is such that the sidewalls of the trench SBD 32 are in contact with the n-type region 15 (1). As a result, even in the connecting region 41, the trench SBD 32 may be caused to function as a parasitic Schottky diode. Therefore, when a negative bias is applied to the drain side of the built-in SBD silicon carbide semiconductor device, even in the connecting region 41, a parasitic Schottky diode is caused to operate, whereby bipolar operation of the parasitic pn diode may be inhibited and forward degradation as well as increases in turn-on loss may be suppressed.

Figure 6:
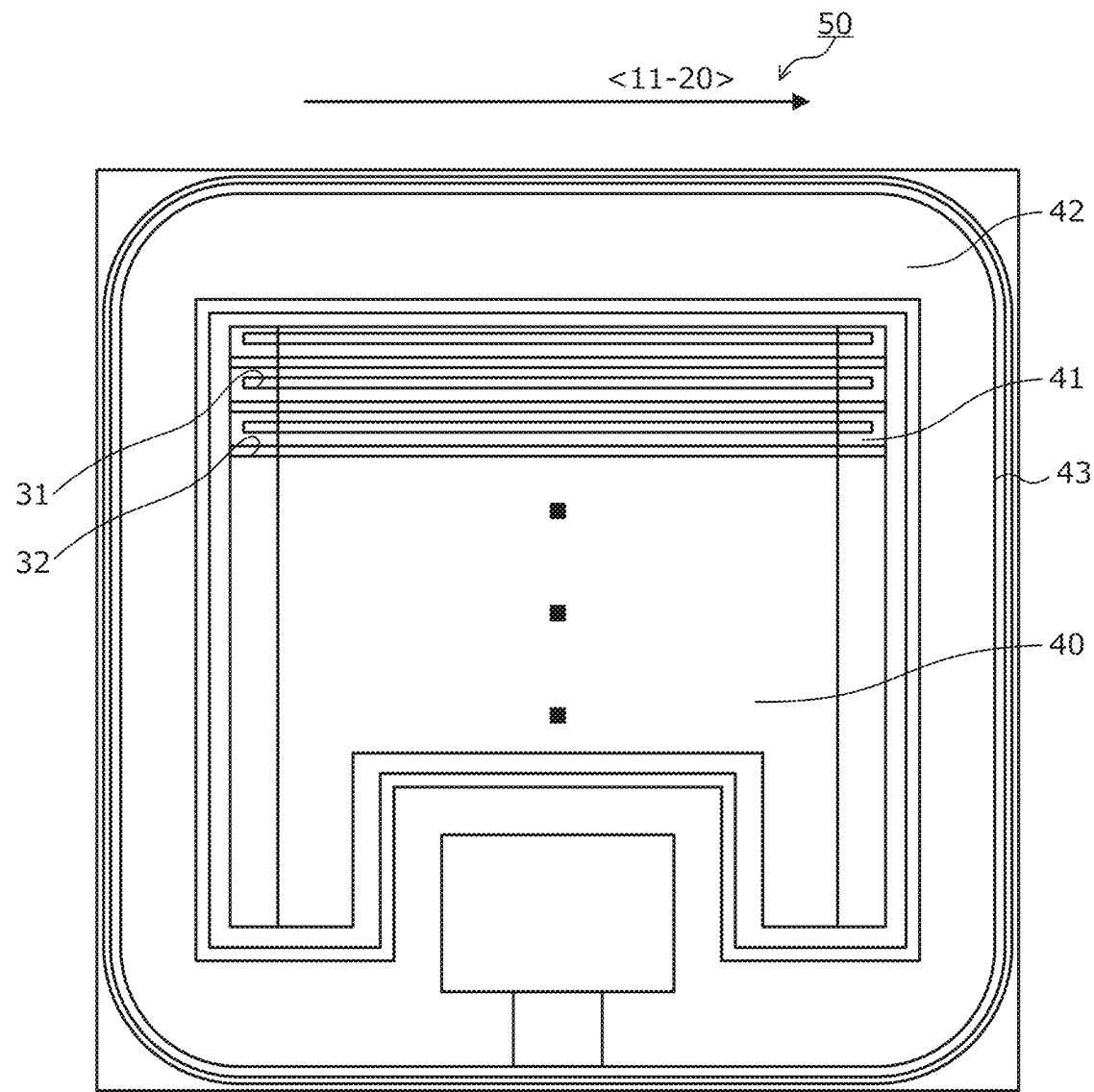
FIG. 6 is a top view depicting an appearance of the silicon carbide semiconductor device according to the embodiment.

FIG. 6 is a top view depicting an appearance of the silicon carbide semiconductor device according to the embodiment. As depicted in FIG. 6, the trench gates 31 are provided in a striped pattern in a direction that is the crystal orientation <11-20> of an n⁺-type silicon carbide substrate 2. In the edge region 42, which surrounds a periphery of the active region 40 and sustains a breakdown voltage, a JTE region 43 is provided as a junction termination extension (JTE) structure for enhancing the overall breakdown voltage of the high-voltage semiconductor device by mitigating or distributing the electric field. Closer to a chip end than is the JTE region 43, an n⁺-type semiconductor region (not depicted) functioning as a channel stopper is provided.

In the embodiment, preferably, a distance W1 between the outer peripheral portion P2 of the trench SBD 32 and ends T of the trench gates 31 may be at least equal to an interval W2 between the trench SBD 32 and each of the trench gates 31. When the distance W1 is shorter than the interval W2, resistance in a current path of the trench SBD 32 increases and capability may drop. Furthermore, preferably, the ends T of the trench gates 31 may be provided farther inward (closer to the active region 40) than is the JTE region 43. Therefore, the outer peripheral portion P2 of the trench SBD 32 is provided at a position facing the gate contact region 26 in a depth direction.

The source electrode 22 is in contact with the n⁺-type source regions 17 via contact holes opened in the interlayer insulating film 21 and is electrically insulated from the gate electrodes 20 by the interlayer insulating film 21. In an instance in which the p⁺⁺-type contact regions are provided, the source electrode 22 is further in contact with the p⁺⁺-type contact regions. Between the source electrode 22 and the interlayer insulating film 21, for example, a barrier metal that prevents diffusion of metal atoms from the source electrode 22 to the gate electrodes 20 may be provided. On the source electrode 22, a source electrode pad (not depicted) is provided. On a back surface (back surface of the n⁺-type silicon carbide substrate 2 constituting an n⁺-type drain region) of the silicon carbide base, a drain electrode (not depicted) is provided.

Figure 10:
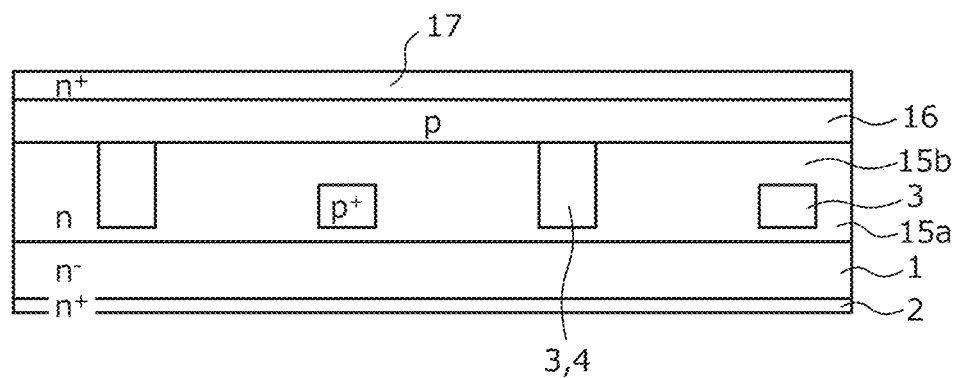
FIG. 10 is a cross-sectional view depicting a state of the silicon carbide semiconductor device according to the embodiment during manufacture (part 4).
Figure 11:
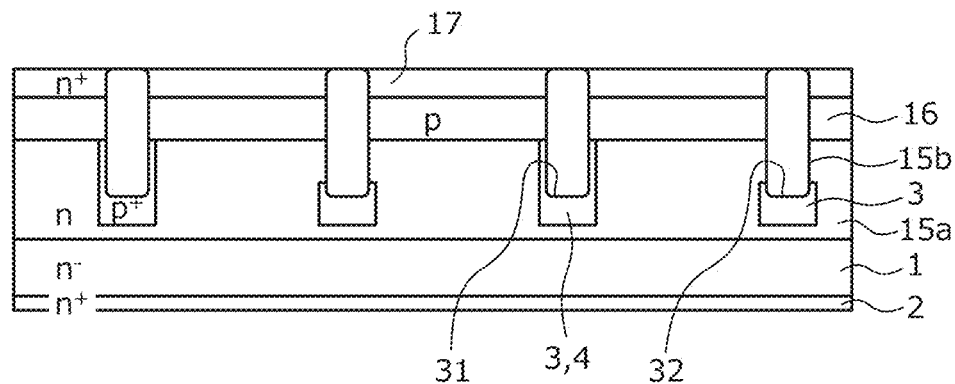
FIG. 11 is a cross-sectional view depicting a state of the silicon carbide semiconductor device according to the embodiment during manufacture (part 5).
Figure 12:
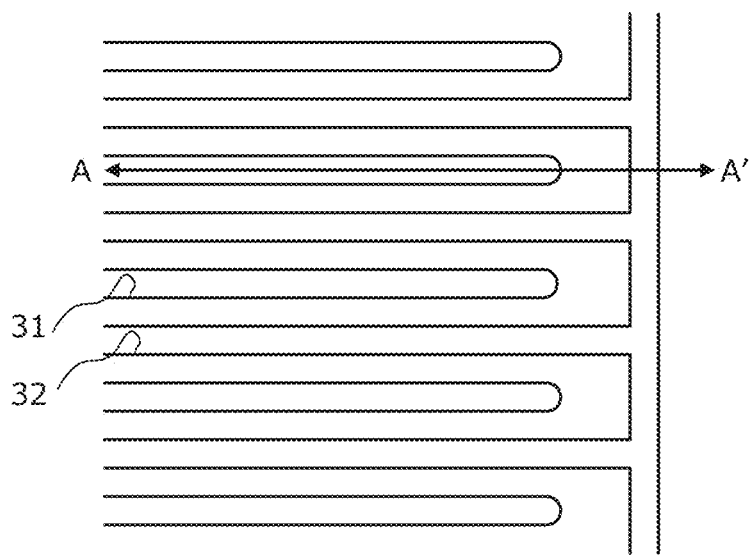
FIG. 12 is a top view depicting a state of the silicon carbide semiconductor device according to the embodiment during manufacture (part 1).

Next, a method of manufacturing the semiconductor device according to the embodiment is described. FIG. 7, FIG. 8, FIG. 9, FIG. 10, and FIG. 11 are cross-sectional views depicting states of the silicon carbide semiconductor device according to the embodiment during manufacture. FIG. 12, FIG. 14, FIG. 16, FIG. 18, FIG. 20, and FIG. 22 are top views depicting states of the silicon carbide semiconductor device according to the embodiment during manufacture. Further, FIG. 13, FIG. 15, FIG. 17, FIG. 19, FIG. 21, and FIG. 23 are cross-sectional views of a portion along A-A' in FIG. 12 depicting a state of the silicon carbide semiconductor device according to the embodiment during manufacture.

Figure 7:
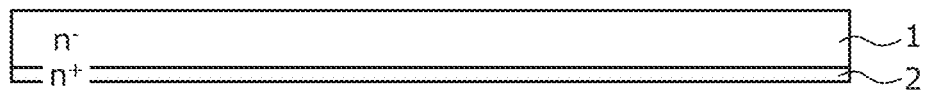
FIG. 7 is a cross-sectional view depicting a state of the silicon carbide semiconductor device according to the embodiment during manufacture (part 1).

First, the n⁺-type silicon carbide substrate 2 that constitutes the n⁺-type drain region is prepared. Next, on the front surface of the n⁺-type silicon carbide substrate 2, the n⁻-type drift layer 1 described above is epitaxially grown. For example, conditions of the epitaxial growth for forming the n⁻-type drift layer 1 may be set so that the impurity concentration of the n⁻-type drift layer 1 becomes about $3\times10^{15}/cm^3$. The state up to here is depicted in FIG. 7.

Figure 8:
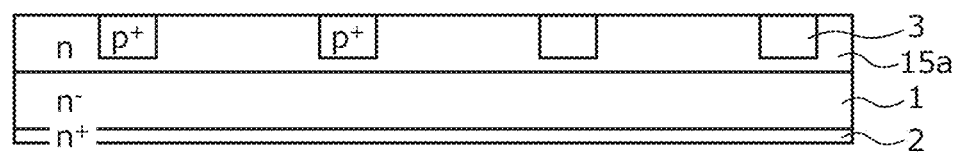
FIG. 8 is a cross-sectional view depicting a state of the silicon carbide semiconductor device according to the embodiment during manufacture (part 2).

Next, on the n⁻-type drift layer 1, a lower n-type region 15a (in an instance in which the n-type region 15 is not formed, an n-type layer having an impurity concentration about the same as that of the n⁻-type drift layer 1, hereinafter, simply "n-type layer") is epitaxially grown. For example, conditions of the epitaxial growth for forming the lower n-type region 15a may be set so that the impurity concentration of the lower n-type region 15a becomes about $1\times10^{17}/cm^3$. The lower n-type region 15a is a portion of the n-type region 15. Next, by photolithography and ion implantation of a p-type impurity, the first p⁺-type regions 3 are selectively formed in a surface layer of the lower n-type region 15a (the n-type layer). For example, a dose amount during the ion implantation for forming the first p⁺-type regions 3 may be set so that the impurity concentration becomes about $5\times10^{18}/cm^3$. The state up to here is depicted in FIG. 8.

Figure 9:
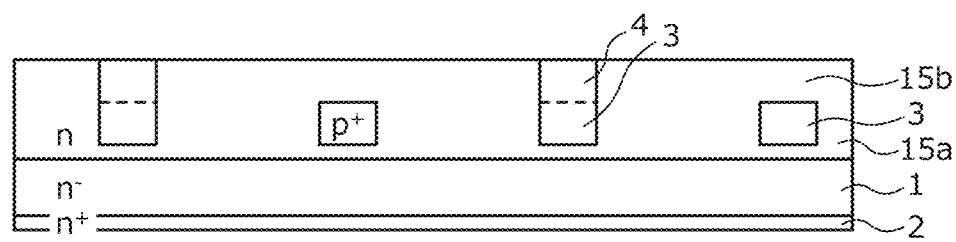
FIG. 9 is a cross-sectional view depicting a state of the silicon carbide semiconductor device according to the embodiment during manufacture (part 3).

Next, on the lower n-type region 15a (the n-type layer) and the first p⁺-type regions 3, an upper n-type region 15b (n-type layer) is epitaxially grown. For example, conditions of the epitaxial growth for forming the upper n-type region 15b may be set so that the impurity concentration of becomes about the same as the impurity concentration of the lower n-type region 15a. The upper n-type region 15b is a portion of the n-type region 15 and the lower n-type region 15a and the upper n-type region 15b combined constitute the n-type region 15. Next, by photolithography and ion implantation of a p-type impurity, the second p⁺-type regions 4 are selectively formed in a surface layer of the upper n-type region 15b (the n-type layer). For example, a dose amount during the ion implantation for forming the second p⁺-type regions 4 may be set so that the impurity concentration becomes about the same as that of the first p⁺-type regions 3. A region that is a combination of one of the first p⁺-type regions 3 and one of the second p⁺-type regions 4 is referred to as "the first, the second p⁺-type regions 3, 4". When the second p⁺-type regions 4 are formed, in the connecting region 41, the second p⁺-type regions 4 are formed so as to be apart from the sidewalls of the trench SBDs 32. The state up to here is depicted in FIG. 9.

Next, the p-type base layer 16 is epitaxially grown on the upper n-type region 15b and the second p⁺-type regions 4. For example, conditions of the epitaxial growth for forming the p-type base layer 16 may be set so that the impurity concentration of the p-type base layer 16 becomes about $4\times10^{17}/cm^3$.

Next, by photolithography and ion implantation of an n-type impurity, the n⁺-type source regions 17 are selectively formed in a surface layer of the p-type base layer 16. For example, a dose amount during the ion implantation for forming the n⁺-type source regions 17 may be set so that the impurity concentration becomes about $3\times10^{20}/cm^3$.

Next, by photolithography and ion implantation of a p-type impurity, in the surface layer of the p-type base layer 16, the p⁺⁺-type contact regions may be selectively formed so as to be in contact with the n⁺-type source regions 17. For example, a dose amount during the ion implantation for forming the p⁺⁺-type contact regions may be set so that the impurity concentration becomes about $3\times10^{20}/cm^3$. The sequence in which the n⁺-type source regions 17 and the p⁺⁺-type contact regions are formed may be interchanged. Next, by photolithography and ion implantation of a p-type impurity, the JTE region 43 is formed in the edge region 42. After all the ion implantations are completed, activation annealing is performed. The state up to here is depicted in FIG. 10.

Next, by photolithography and etching, the trench gates 31 that penetrate through the n⁺-type source regions 17 and the p-type base layer 16 and reach the n-type region 15 (1) are formed. The bottoms of the trench gates 31 may reach the first p⁺-type regions 3 or may be positioned in the n-type region 15 (1), between the p-type base layer 16 and the first p⁺-type regions 3. Subsequently, a mask used to form the trench gates 31 is removed. Further, an oxide film is used as the mask during trench formation. Further, after the trench etching, isotropic etching for removing damage of the trench gates 31 and hydrogen annealing for rounding corners of openings of the trench gates 31 and the bottoms of the trench gates 31 may be performed. The isotropic etching or the hydrogen annealing alone may be performed. Further, the hydrogen annealing may be performed after the isotropic etching is performed.

Next, by photolithography and etching, the trench SBD 32 that penetrates through the n⁺-type source regions 17 and the p-type base layer 16, and reaches the n-type region 15 (1) is formed. The bottom of the trench SBD 32 may reach the first p⁺-type regions 3 or may be positioned in the n-type region 15 (1), between the p-type base layer 16 and the first p⁺-type regions 3. Subsequently, a mask used to form the trench SBD 32 is removed. At this time, the distance W1 between the outer peripheral portion P2 of the trench SBD 32 and each of the ends T of the trench gates 31 is at least equal to the interval W2 between the trench SBD 32 and each of the trench gates 31, and ends of the trench gates 31 are formed so as to be closer to the active region 40 than is the JTE region 43. The state up to here is depicted in FIG. 11.

Next, the gate insulating film 19 is formed along the front surface of the silicon carbide base and the inner walls of the trench gates 31. Next, along the inner walls of the trench SBD 32, a metal film is formed containing, for example, titanium (Ti). Next, for example, a heat treatment (annealing) is performed under a nitrogen ($N_2$) atmosphere of a temperature that is at most about 500 degrees C., whereby the Schottky barrier junctions between the metal film and semiconductor regions are formed at the inner walls of the trench SBD 32.

Figure 13:
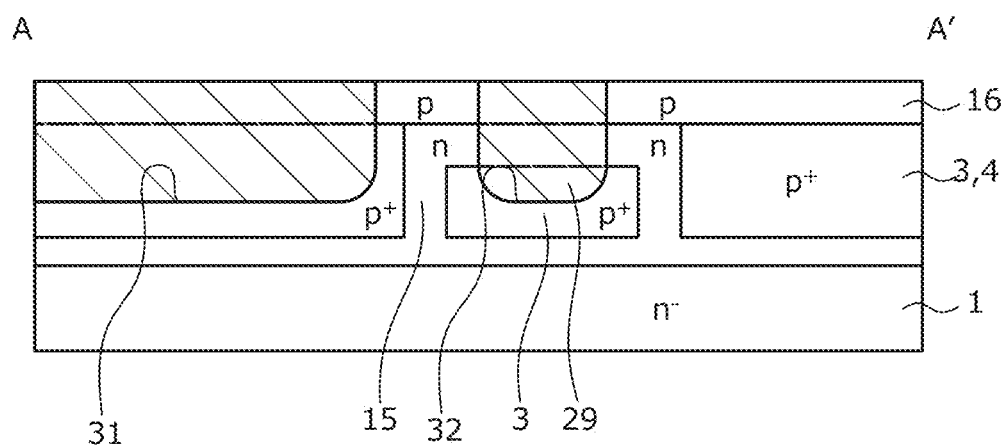
FIG. 13 is a cross-sectional view of a portion along A-A' in FIG. 12 depicting a state of the silicon carbide semiconductor device according to the embodiment during manufacture (part 1).

Next, a polysilicon is deposited so as to be embedded in the trench gates 31 and the trench SBD 32, the polysilicon further being etched, thereby leaving the polysilicon constituting the gate electrodes 20 in the trench gates 31 and leaving the polysilicon in the trench SBD 32. Here, etchback may be performed and the polysilicon may be etched so as to be left deeper than the base surface. In this manner, the polysilicon is embedded in the trench SBD 32, whereby the trench SBD 32 is formed by heterojunctions between the metal film and the polysilicon. A top view of the state up to here is shown in FIG. 12 while a cross-section along in A-A' in FIG. 12 is shown in FIG. 13.

Figure 14:
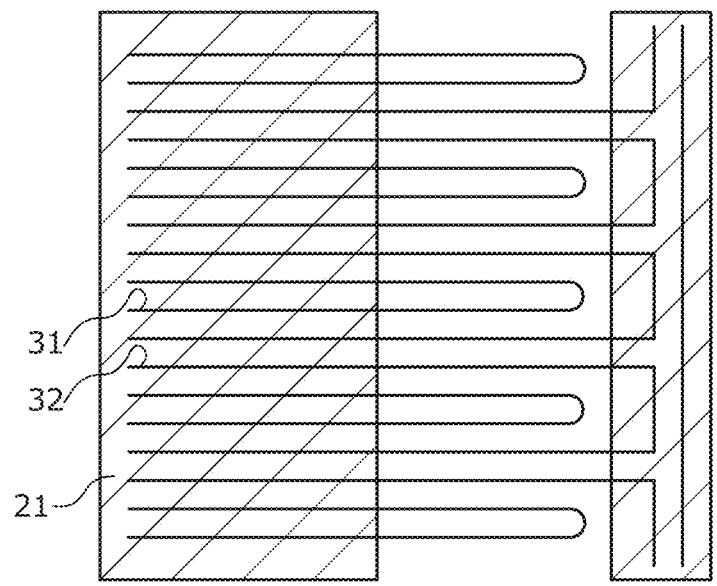
FIG. 14 is a top view depicting a state of the silicon carbide semiconductor device according to the embodiment during manufacture (part 2).
Figure 15:
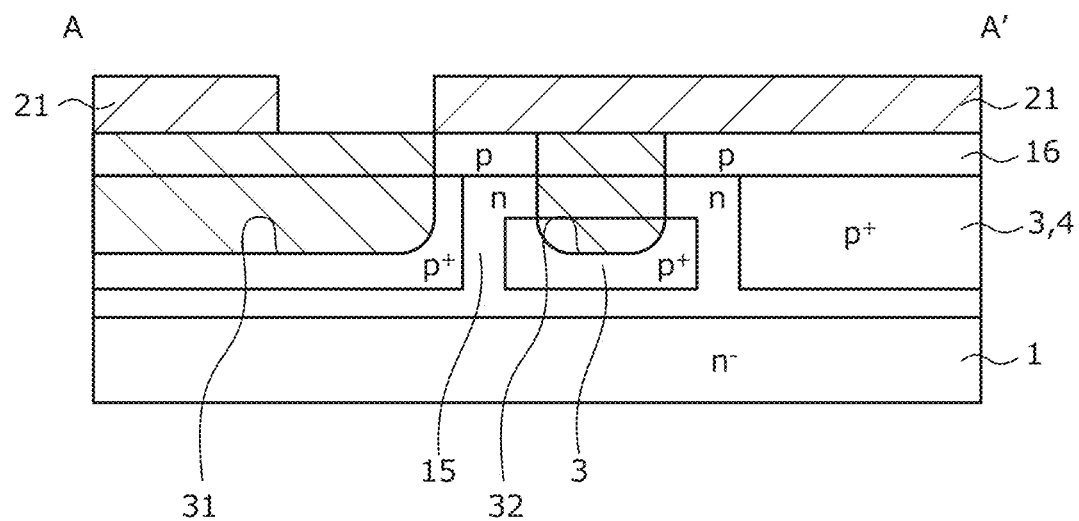
FIG. 15 is a cross-sectional view of the portion along A-A' in FIG. 12 depicting a state of the silicon carbide semiconductor device according to the embodiment during manufacture (part 2).

Next, the interlayer insulating film 21 is formed on an entire area of the front surface of the silicon carbide base, so as to cover the gate electrodes 20. The interlayer insulating film 21 is formed by, for example, a non-doped silicate glass (NSG), phosphosilicate glass (PSG), borophosphosilicate glass (BPSG), High Temperature Oxide (HTO), or a combination thereof. Next, the interlayer insulating film 21 and the gate insulating film 19 are patterned and contact holes are formed, thereby exposing the n⁺-type source regions 17. In an instance in which the p⁺⁺-type contact regions are formed, the n⁺-type source regions 17 and the p⁺⁺-type contact regions are exposed. The trench gates 31 open the interlayer insulating film 21 only in the connecting region 41. A top view of the state up to here is shown in FIG. 14 while a cross-section along A-A' in FIG. 12 of this state is shown in FIG. 15.

Next, the barrier metal is formed so as to cover the interlayer insulating film 21 and is patterned, thereby again exposing the $n^+$-type source regions 17 and the $p^{++}$-type contact regions. Next, the source electrode 22 is formed so as to be in contact with the polysilicon embedded in the $n^+$-type source regions 17 and the trench SBD 32. The source electrode 22 may be formed so as to cover the barrier metal or may be formed only in the contact holes.

Figure 16:
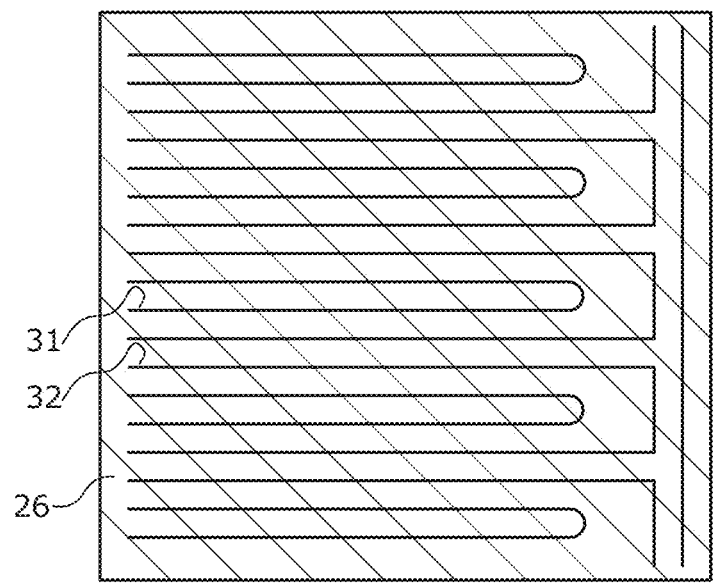
FIG. 16 is a top view depicting a state of the silicon carbide semiconductor device according to the embodiment during manufacture (part 3).
Figure 17:
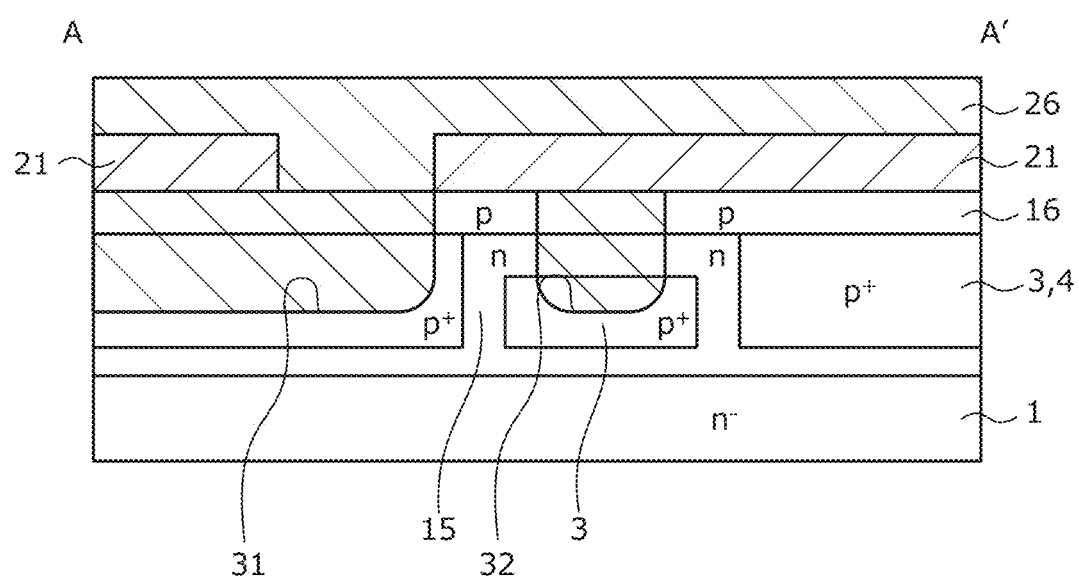
FIG. 17 is a cross-sectional view of the portion along A-A' in FIG. 12 depicting a state of the silicon carbide semiconductor device according to the embodiment during manufacture (part 3).
Figure 18:
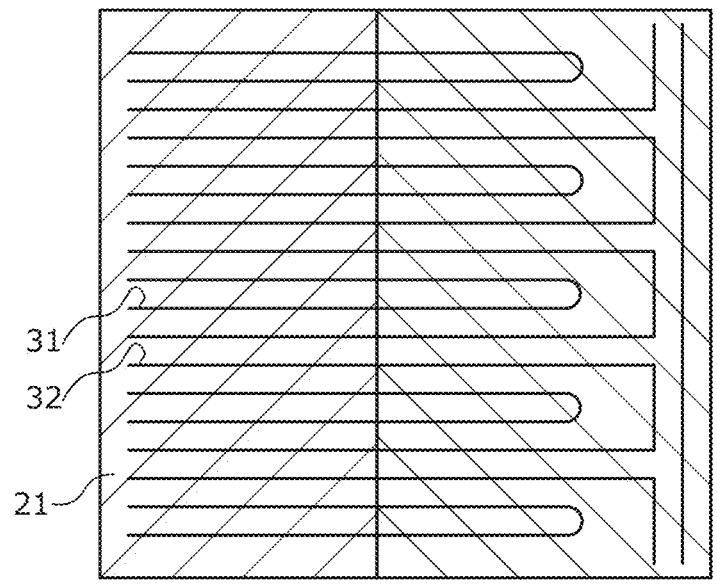
FIG. 18 is a top view depicting a state of the silicon carbide semiconductor device according to the embodiment during manufacture (part 4).
Figure 19:
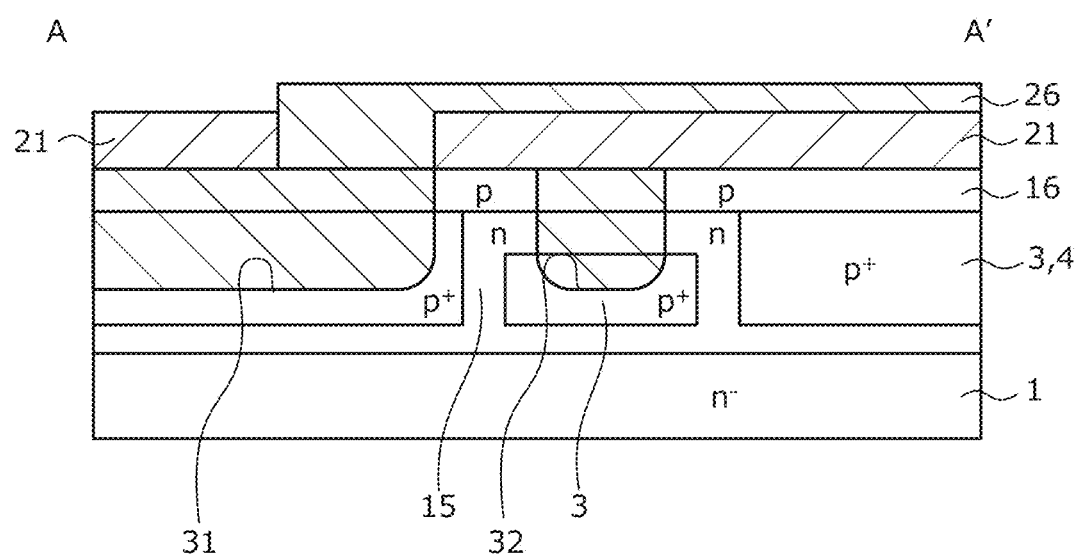
FIG. 19 is a cross-sectional view of the portion along A-A' in FIG. 12 depicting a state of the silicon carbide semiconductor device according to the embodiment during manufacture (part 4).

Next, a polysilicon (Poly-Si) is deposited on an entire area of the front surface of the silicon carbide base. A top view of the state up to here is shown in FIG. 16 while a cross-section along A-A' in FIG. 12 of this state is shown in FIG. 17. Next, the polysilicon is patterned by etching and is left only in the gate runner direction, whereby the gate contact region 26 is formed. A top view of the state up to here is shown in FIG. 18 while a cross-section along A-A' in FIG. 12 of this state is shown in FIG. 19. In this manner, the polysilicon deposition is divided into two sessions, an instance of embedding the polysilicon in the trench SBD 32 and an instance of forming the gate contact region 26, whereby the gate contact region 26 may be formed widely above the trench SBD 32.

Figure 20:
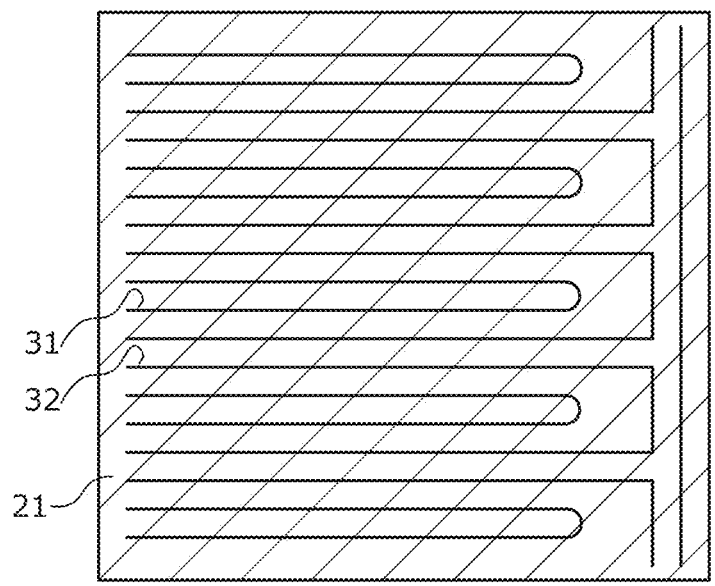
FIG. 20 is a top view depicting a state of the silicon carbide semiconductor device according to the embodiment during manufacture (part 5).
Figure 21:
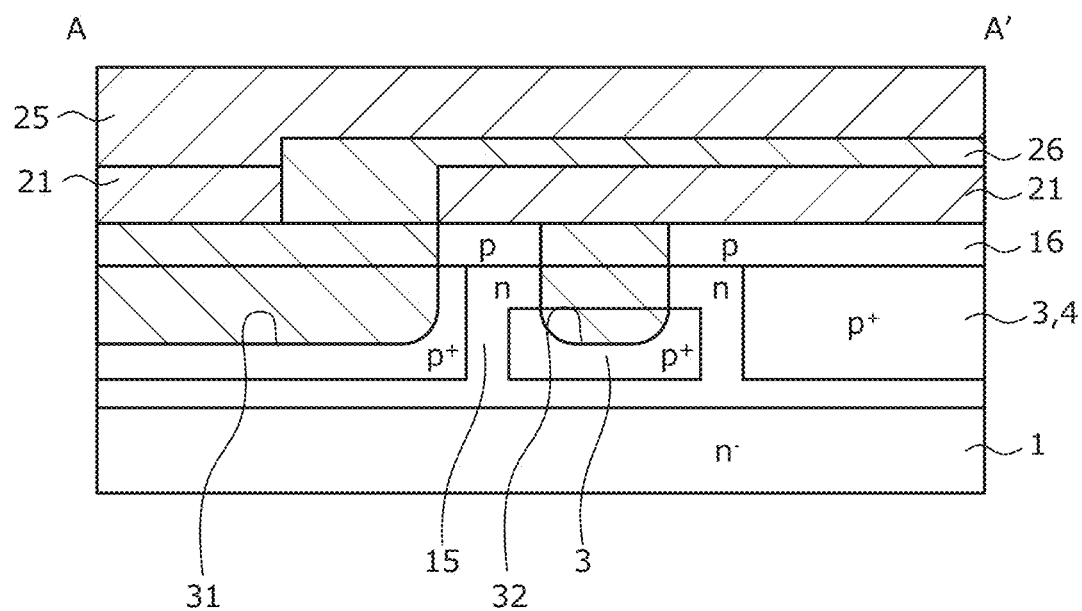
FIG. 21 is a cross-sectional view of the portion along A-A' in FIG. 12 depicting a state of the silicon carbide semiconductor device according to the embodiment during manufacture (part 5).

Next, the interlayer insulating film 25 is formed on an entire area of the front surface of the silicon carbide base. The interlayer insulating film 25 is formed by, for example, NSG, PSG, HTO, or a combination thereof. A top view of the state up to here is shown in FIG. 20 while a cross-section along A-A' in FIG. 12 of this state is shown in FIG. 21. Next, the interlayer insulating film 25 is patterned, forming contact holes and thereby, exposing the gate contact region 26.

Figure 22:
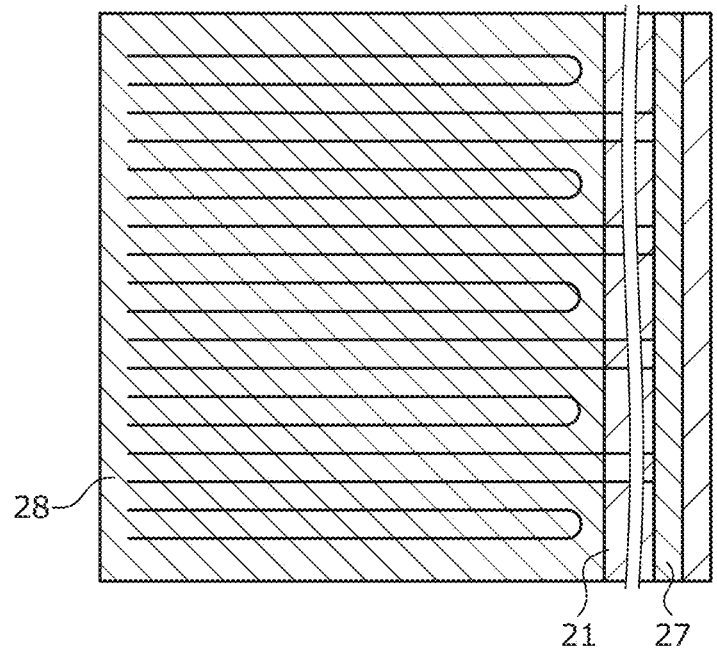
FIG. 22 is a top view depicting a state of the silicon carbide semiconductor device according to the embodiment during manufacture (part 6).
Figure 23:
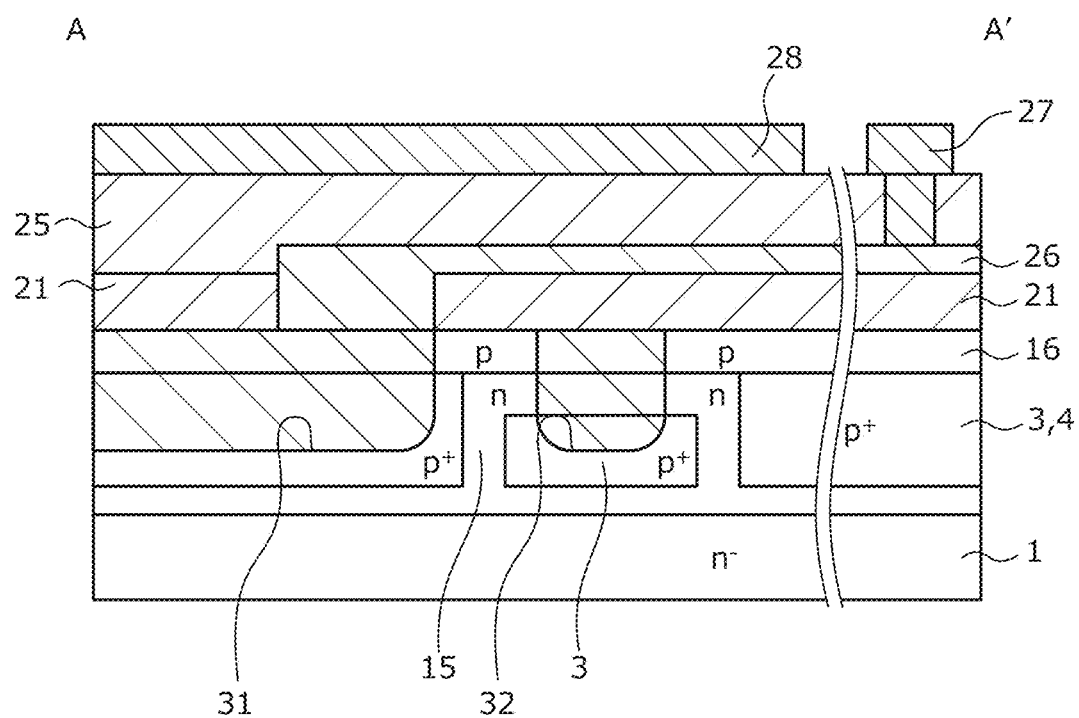
FIG. 23 is a cross-sectional view of the portion along A-A' in FIG. 12 depicting a state of the silicon carbide semiconductor device according to the embodiment during manufacture (part 6).

Next, a source electrode pad 28 and the gate runner 27 are formed so as to be embedded in the contact holes. A portion of a metal layer deposited to form the source electrode pad 28 may constitute the gate electrode pad. A top view of the state up to here is shown in FIG. 22 while a cross-section along A-A' in FIG. 12 of this state is shown in FIG. 23. On the back surface of the $n^+$-type silicon carbide substrate 2, a metal film such as a nickel (Ni) film, a titanium (Ti) film, etc. is formed in a contact portion of the drain electrode using sputtering deposition or the like. The metal film may be a combination of stacked layers of Ni films and Ti films. Thereafter, annealing such as a rapid heat treatment (rapid thermal annealing (RTA)) is performed so as to convert the metal film into a silicide and thereby form an ohmic contact. Thereafter, for example, a thick film such as a stacked film sequentially containing a Ti film, a Ni film, and gold (Au) film is formed by electron beam (EB) deposition or the like, thereby forming the drain electrode.

In the epitaxial growth and the ion implantations described above, as an n-type impurity (n-type dopant), for example, nitrogen (N), phosphorus (P) arsenic (As), antimony (Sb), etc. that are n-types with respect to silicon carbide may be used. As a p-type impurity (p-type dopant), for example, boron (B), aluminum (Al), gallium (Ga), indium (In), thallium (Tl), etc. that are p-types with respect to silicon carbide may be used. In this manner, the MOSFET depicted in FIG. 1 to FIG. 4 is completed.

As described above, according to the embodiment, the trench SBD surrounds the trench gates. As a result, portions in contact with the source electrode of the trench gates are inside the region surrounded by the trench SBD. Therefore, outside the region surrounded by the trench SBD, when negative bias is applied to the drain side of the built-in SBD silicon carbide semiconductor device, bipolar operation of a parasitic pn diode is eliminated, enabling forward degradation as well as increases in turn-on loss to be suppressed.

In the foregoing, the present invention may be variously modified within a range not departing from the spirit of the invention and in the embodiments described above, for example, dimensions, impurity concentrations, etc. of parts may be variously set according to necessary specifications. Further, in the described embodiments, while a MOSFET is described as an example, without limitation hereto, application is further possible to various types of silicon carbide semiconductor devices that conduct and block current by gate-driven control based on a predetermined gate threshold. Gate-driven controlled silicon carbide semiconductor devices, for example, include insulated gate bipolar transistor (IGBTs) and the like. Further, in the embodiments described, while an instance in which silicon carbide is used as a wide band gap semiconductor is described as an example, a wide band gap semiconductor other than silicon carbide such as, for example, gallium nitride (GaN) is applicable. Further, in the embodiments, while the first conductivity type is assumed to be an n-type and the second conductivity type is assumed to be a p-type, the present invention is similarly implemented when the first conductivity type is a p-type and the second conductivity type is an n-type.

According to the invention described above, the trench SBD (second trench) surrounds the trench gates (first trenches). As a result, portions in contact with the source electrode of the trench gates are inside the region surrounded by the trench SBD. Therefore, outside the region surrounded by the trench SBD, when negative bias is applied to the drain side of the built-in SBD silicon carbide semiconductor device, bipolar operation of a parasitic pn diode is eliminated, enabling forward degradation to be suppressed as well as increases in turn-on loss to be suppressed.

The semiconductor device according to the present invention achieves an effect in that forward voltage degradation and loss during turn-on may be reduced.

As described above, the semiconductor device according to the present invention is useful for power semiconductor devices used in power converting equipment, power source devices of various types of industrial machines, etc. and is particularly suitable for silicon carbide semiconductor devices having a trench gate structure.

REFERENCE CHARACTERS 1, 101 $n^-$-type drift layer
2, 102 $n^+$-type silicon carbide substrate
3, 103 first $p^+$-type region
4, 104 second $p^+$-type region
5, 105 $p^+$-type region
15, 115 n-type region
15a lower n-type region
15b upper n-type region
16, 116 p-type base layer
17, 117 $n^+$-type source region
18, 118 $p^{++}$-type contact region
19, 119 gate insulating film
20, 120 gate electrode
21, 121 interlayer insulating film
22, 122 source electrode
25 interlayer insulating film
26 gate contact region
27 gate runner 28 source electrode pad
29, 129 Schottky metal
31, 131 trench gate
32, 132 trench SBDs
40, 140 active region
41, 141 connecting region
42, 142 edge region
43 JTE region
50, 150 built-in SBD silicon carbide semiconductor device

What is claimed is:

1. A silicon carbide semiconductor device comprising:
a drift layer of a first conductivity type provided in a semiconductor base containing silicon carbide;
a base layer of a second conductivity type provided in the semiconductor base at a front surface side thereof;
a plurality of first trenches provided in the semiconductor base at the front surface side thereof, and having a plurality of first portions extending in a first direction to form a striped pattern;
a second trench provided in the semiconductor base at the front surface side thereof, and having a plurality of second portions extending parallel to the plurality of first portions;
a plurality of gate electrodes respectively provided in the plurality of first trenches; and
a diode electrode provided in the second trench, wherein the diode electrode includes:
a plurality of inner electrodes provided in the plurality of second portions, and
an outer electrode connecting the plurality of inner electrodes and surrounding ends of the first portions in a plan view of the silicon carbide semiconductor device, and
in the first direction, the second portions is spaced apart from the ends of the first portions by a predetermined distance.

2. The silicon carbide semiconductor device according to claim 1, wherein the predetermined distance is no smaller than an interval between one of the first portions and an adjacent one of the second portions in a second direction perpendicular to the first direction.

3. The silicon carbide semiconductor device according to claim 1, wherein the plurality of gate electrodes is formed by polysilicon embedded in the first trenches.

4. The silicon carbide semiconductor device according to claim 1, wherein the diode electrode is formed by a polysilicon and a metal film embedded in the second trench.

5. The silicon carbide semiconductor device according to claim 1, wherein the second trench has a plurality of semiconductor regions exposed at inner walls thereof, which form Schottky barrier junctions with the diode electrode.

6. The silicon carbide semiconductor device according to claim 1, further comprising a plurality of source regions of the first conductivity type selectively provided in the base layer and in contact with the first trenches and the second trench.

7. The silicon carbide semiconductor device according to claim 1, further comprising:
an active region through which a main current passes; and
an edge region that surrounds a periphery of the active region in the plan view of the silicon carbide semiconductor device.

8. The silicon carbide semiconductor device according to claim 7, wherein the edge region has a junction termination extension (JTE) region provided therein.

9. The silicon carbide semiconductor device according to claim 8, wherein the ends of the first portions are provided further inward than is the JTE region in the plan view of the silicon carbide semiconductor device.

10. The silicon carbide semiconductor device according to claim 7, wherein the active region and the edge region have a connecting region provided therebetween.

11. The silicon carbide semiconductor device according to claim 10, further comprising a gate insulating film provided between the first trenches and the gate electrodes, wherein
in the connecting region, side surfaces of the first trenches are covered by a semiconductor region of the second conductivity type.

12. The silicon carbide semiconductor device according to claim 10, wherein in the connecting region, side surfaces of the second trench are in contact with a semiconductor region of the first conductivity type.

13. The silicon carbide semiconductor device according to claim 1, further comprising:
a first region of the second conductivity type selectively provided to be in contact with a bottom of at least one of the second trench and the first trenches; and
a second region of the second conductivity type provided immediately beneath the outer electrode, wherein
the first region and the second region are separated from each other in the first direction.

14. The silicon carbide semiconductor device according to claim 10, further comprising an interlayer insulating film provided in the semiconductor base at the front surface side thereof, and covering the gate electrodes, wherein
the interlayer insulating film has openings in the connecting region.

15. The silicon carbide semiconductor device according to claim 14, further comprising a gate contact region formed by a polysilicon layer provided in the openings.

16. The silicon carbide semiconductor device according to claim 15, wherein a portion of the second trench is provided at a position facing the gate contact region in a depth direction.

17. The silicon carbide semiconductor device according to claim 15, wherein the outer electrode is provided at a position facing the gate contact region in a depth direction.

18. The silicon carbide semiconductor device according to claim 15, further comprising a gate runner connected to the gate contact region.

19. The silicon carbide semiconductor device according to claim 1, wherein the first portions and the second portions are disposed alternately.

20. A silicon carbide semiconductor device comprising:
a drift layer of a first conductivity type provided in a semiconductor base containing silicon carbide;
a base layer of a second conductivity type provided in the semiconductor base at a front surface side thereof;
a plurality of first trenches provided in the semiconductor base at a front surface side thereof, and having a plurality of first portions extending in a first direction to form a striped pattern;
a second trench provided in the semiconductor base at a front surface side thereof, and having a plurality of second portions extending parallel to the plurality of first portions;
a plurality of gate electrodes respectively provided in the plurality of first trenches; and
a diode electrode provided in the second trench, wherein the diode electrode includes:
a plurality of inner electrodes provided in the plurality of second portions, and an outer electrode connecting the plurality of inner electrodes and surrounding ends of the first portions in a plan view of the silicon carbide semiconductor device.

* * * * *